United States Patent
Lin et al.

(10) Patent No.: US 9,633,934 B2
(45) Date of Patent: Apr. 25, 2017

(54) SEMICONDUTOR DEVICE AND METHOD OF MANUFACTURE

(71) Applicant: Taiwan Semiconductor Manufacturing Company, Ltd., Hsin-Chu (TW)

(72) Inventors: Jing-Cheng Lin, Hsin-Chu (TW); Po-Hao Tsai, Zhongli (TW); Li-Hui Cheng, New Taipei (TW); Porter Chen, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/555,405

(22) Filed: Nov. 26, 2014

(65) Prior Publication Data

US 2016/0148857 A1 May 26, 2016

(51) Int. Cl.
*H01L 23/498* (2006.01)
*H01L 21/56* (2006.01)
(Continued)

(52) U.S. Cl.
CPC ...... *H01L 23/49811* (2013.01); *H01L 21/561* (2013.01); *H01L 24/19* (2013.01); *H01L 24/20* (2013.01); *H01L 24/92* (2013.01); *H01L 24/97* (2013.01); *H01L 25/105* (2013.01); *H01L 21/568* (2013.01); *H01L 23/3128* (2013.01); *H01L 23/5389* (2013.01); *H01L 25/0657* (2013.01); *H01L 2224/04105* (2013.01); *H01L 2224/12105* (2013.01); *H01L 2224/16145* (2013.01); *H01L 2224/32145* (2013.01); *H01L 2224/48091* (2013.01); *H01L 2224/48227* (2013.01); *H01L 2224/73259* (2013.01); *H01L 2224/73265* (2013.01); *H01L 2224/83005* (2013.01); *H01L 2224/9222* (2013.01); *H01L 2224/97* (2013.01); *H01L 2225/0651* (2013.01);
(Continued)

(58) Field of Classification Search
CPC ............................................. H01L 2924/01079
See application file for complete search history.

(56) References Cited

U.S. PATENT DOCUMENTS 6,555,906 B2   4/2003   Towle et al.
7,619,901 B2   11/2009  Eichelberger et al.
(Continued)

FOREIGN PATENT DOCUMENTS

KR   2012-0077875   7/2012
KR   2012-0101885   9/2012
KR   2014-0043651   4/2014

OTHER PUBLICATIONS

Korean Office Action issued on May 1, 2016 in Patent Application No. 10-2015-0016527 filed Feb. 3, 2015.

*Primary Examiner* — Fernando L Toledo
*Assistant Examiner* — Neil Prasad
(74) *Attorney, Agent, or Firm* — Haynes and Boone, LLP

(57) ABSTRACT

A semiconductor device and method for providing an enhanced removal of heat from a semiconductor die within an integrated fan out package on package configuration is presented. In an embodiment a metal layer is formed on a backside of the semiconductor die, and the semiconductor die along and through vias are encapsulated. Portions of the metal layer are exposed and a thermal die is connected to remove heat from the semiconductor die.

20 Claims, 12 Drawing Sheets

(51) Int. Cl.
  *H01L 23/00* (2006.01)
  *H01L 25/10* (2006.01)
  *H01L 23/31* (2006.01)
  *H01L 23/538* (2006.01)
  *H01L 25/065* (2006.01)

(52) U.S. Cl.
  CPC ............. *H01L 2225/06568* (2013.01); *H01L 2225/1023* (2013.01); *H01L 2225/1035* (2013.01); *H01L 2225/1058* (2013.01); *H01L 2924/15311* (2013.01); *H01L 2924/181* (2013.01)

(56) References Cited

U.S. PATENT DOCUMENTS

| | | |
|---|---|---|
| 8,097,490 B1 | 1/2012 | Pagaila et al. |
| 8,133,762 B2 | 3/2012 | Pagaila et al. |
| 8,193,604 B2 | 6/2012 | Lin et al. |
| 8,354,304 B2 | 1/2013 | Chow et al. |
| 8,474,133 B2 | 7/2013 | Eichelberger et al. |
| 8,476,824 B2 | 7/2013 | Yu et al. |
| 8,742,579 B2 | 6/2014 | Pagaila et al. |
| 8,796,846 B2 | 8/2014 | Lin et al. |
| 9,000,583 B2 * | 4/2015 | Haba et al. .................... 257/735 |
| 2008/0029886 A1 * | 2/2008 | Cotte ....................... H01L 23/66 257/728 |
| 2008/0157330 A1 | 7/2008 | Kroehnert et al. |
| 2009/0236752 A1 | 9/2009 | Lee et al. |
| 2011/0193216 A1 | 8/2011 | Lin et al. |
| 2012/0119378 A1 | 5/2012 | Ng et al. |
| 2012/0171814 A1 | 7/2012 | Choi et al. |
| 2012/0199981 A1 | 8/2012 | Jeong et al. |
| 2012/0319284 A1 | 12/2012 | Ko et al. |
| 2013/0297981 A1 | 11/2013 | Gu et al. |
| 2014/0091471 A1 | 4/2014 | Chen et al. |
| 2014/0110840 A1 * | 4/2014 | Wojnowski et al. ......... 257/738 |
| 2014/0203443 A1 | 7/2014 | Pagaila et al. |
| 2014/0252646 A1 | 9/2014 | Hung et al. |

* cited by examiner ns.
SEMICONDUTOR DEVICE AND METHOD OF MANUFACTURE

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
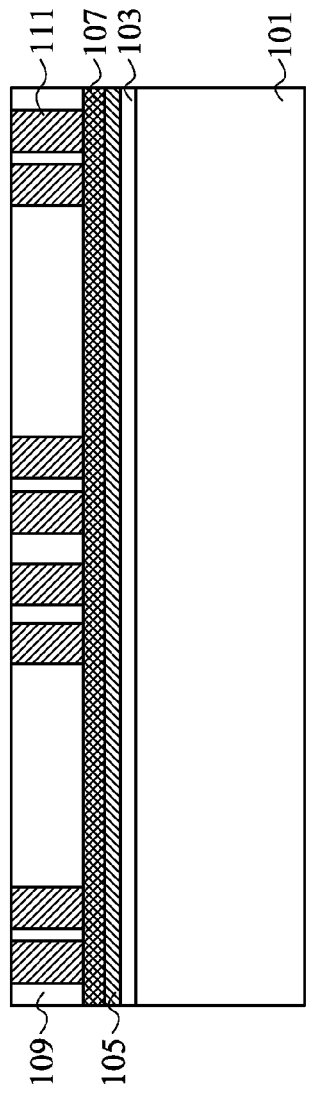
FIG. 1 illustrates formation of through vias, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is shown a carrier substrate 101 with an adhesive layer 103, a polymer layer 105, and a first seed layer 107 over the carrier substrate 101. The carrier substrate 101 comprises, for example, silicon based materials, such as glass or silicon oxide, or other materials, such as aluminum oxide, combinations of any of these materials, or the like. The carrier substrate 101 is planar in order to accommodate an attachment of semiconductor devices such as a first semiconductor device 201 and a second semiconductor device 301 (not illustrated in FIG. 1 but illustrated and discussed below with respect to FIGS. 2A-3).

The adhesive layer 103 is placed on the carrier substrate 101 in order to assist in the adherence of overlying structures (e.g., the polymer layer 105). In an embodiment the adhesive layer 103 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The adhesive layer 103 may be placed onto the carrier substrate 101 in a semi-liquid or gel form, which is readily deformable under pressure.

The polymer layer 105 is placed over the adhesive layer 103 and is utilized in order to provide protection to, e.g., the first semiconductor device 201 and the second semiconductor device 301 once the first semiconductor device 201 and the second semiconductor device 301 have been attached. In an embodiment the polymer layer 105 may be polybenzoxazole (PBO), although any suitable material, such as polyimide or a polyimide derivative, Solder Resistance (SR), or Ajinomoto build-up film (ABF) may alternatively be utilized. The polymer layer 105 may be placed using, e.g., a spin-coating process to a thickness of between about 2 μm and about 15 μm, such as about 5 μm, although any suitable method and thickness may alternatively be used.

The first seed layer 107 is formed over the polymer layer 105. In an embodiment the first seed layer 107 is a thin layer of a conductive material that aids in the formation of a thicker layer during subsequent processing steps. The first seed layer 107 may comprise a layer of titanium about 1,000 Å thick followed by a layer of copper about 5,000 Å thick. The first seed layer 107 may be created using processes such as sputtering, evaporation, or PECVD processes, depending upon the desired materials. The first seed layer 107 may be formed to have a thickness of between about 0.3 μm and about 1 μm, such as about 0.5 μm.

FIG. 1 also illustrates a placement and patterning of a photoresist 109 over the first seed layer 107. In an embodiment the photoresist 109 may be placed on the first seed layer 107 using, e.g., a spin coating technique to a height of between about 50 μm and about 250 μm, such as about 120 μm. Once in place, the photoresist 109 may then be patterned by exposing the photoresist 109 to a patterned energy source (e.g., a patterned light source) so as to induce a chemical reaction, thereby inducing a physical change in those portions of the photoresist 109 exposed to the patterned light source. A developer is then applied to the exposed photoresist 109 to take advantage of the physical changes and selectively remove either the exposed portion of the photoresist 109 or the unexposed portion of the photoresist 109, depending upon the desired pattern.

In an embodiment the pattern formed into the photoresist 109 is a pattern for vias 111. The vias 111 are formed in such a placement as to be located on different sides of subsequently attached devices such as the first semiconductor device 201 and the second semiconductor device 301. However, any suitable arrangement for the pattern of vias 111, such as by being located such that the first semiconductor device 201 and the second semiconductor device are placed on opposing sides of the vias 111, may alternatively be utilized.

In an embodiment the vias 111 are formed within the photoresist 109. In an embodiment the vias 111 comprise one or more conductive materials, such as copper, tungsten, other conductive metals, or the like, and may be formed, for example, by electroplating, electroless plating, or the like. In an embodiment, an electroplating process is used wherein the first seed layer 107 and the photoresist 109 are submerged or immersed in an electroplating solution. The first seed layer 107 surface is electrically connected to the negative side of an external DC power supply such that the first seed layer 107 functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer 107, acquires the dissolved atoms, thereby plating the exposed conductive areas of the first seed layer 107 within the opening of the photoresist 109.

Once the vias 111 have been formed using the photoresist 109 and the first seed layer 107, the photoresist 109 may be removed using a suitable removal process (not illustrated in FIG. 1 but seen in FIG. 3 below). In an embodiment, a plasma ashing process may be used to remove the photoresist 109, whereby the temperature of the photoresist 109 may be increased until the photoresist 109 experiences a thermal decomposition and may be removed. However, any other suitable process, such as a wet strip, may alternatively be utilized. The removal of the photoresist 109 may expose the underlying portions of the first seed layer 107.

Once exposed a removal of the exposed portions of the first seed layer 107 may be performed (not illustrated in FIG. 1 but seen in FIG. 3 below). In an embodiment the exposed portions of the first seed layer 107 (e.g., those portions that are not covered by the vias 111) may be removed by, for example, a wet or dry etching process. For example, in a dry etching process reactants may be directed towards the first seed layer 107 using the vias 111 as masks. In another embodiment, etchants may be sprayed or otherwise put into contact with the first seed layer 107 in order to remove the exposed portions of the first seed layer 107. After the exposed portion of the first seed layer 107 has been etched away, a portion of the polymer layer 105 is exposed between the vias 111.

Figure 2A:
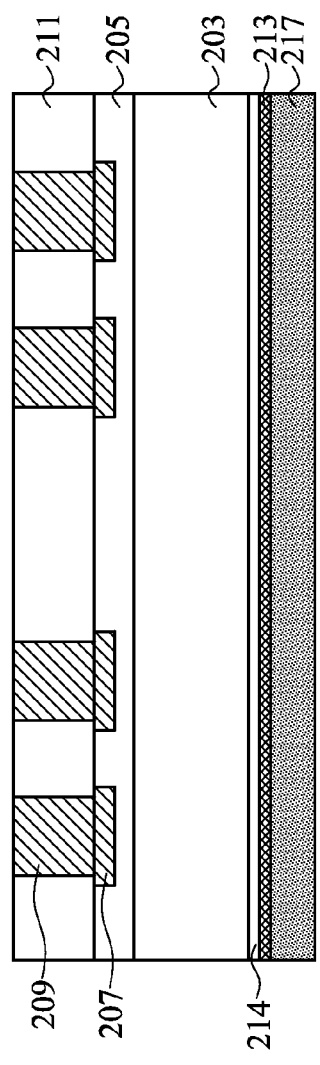
FIGS. 2A-2B illustrate embodiments of a semiconductor device with a metal layer, in accordance with some embodiments.

FIG. 2A illustrates a first semiconductor device 201 that will be attached to the polymer layer 105 within the vias 111 (not illustrated in FIG. 2 but illustrated and described below with respect to FIG. 3). In an embodiment the first semiconductor device 201 comprises a first substrate 203, first active devices (not individually illustrated), first metallization layers 205, first contact pads 207, a first passivation layer 211, and first external connectors 209. The first substrate 203 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional requirements of the design for the first semiconductor device 201. The first active devices may be formed using any suitable methods either within or else on the first substrate 203.

The first metallization layers 205 are formed over the first substrate 203 and the first active devices and are designed to connect the various active devices to form functional circuitry. In an embodiment the first metallization layers 205 are formed of alternating layers of dielectric and conductive material and may be formed through any suitable process (such as deposition, damascene, dual damascene, etc.). In an embodiment there may be four layers of metallization separated from the first substrate 203 by at least one interlayer dielectric layer (ILD), but the precise number of first metallization layers 205 is dependent upon the design of the first semiconductor device 201.

The first contact pads 207 may be formed over and in electrical contact with the first metallization layers 205. The first contact pads 207 may comprise aluminum, but other materials, such as copper, may alternatively be used. The first contact pads 207 may be formed using a deposition process, such as sputtering, to form a layer of material (not shown) and portions of the layer of material may then be removed through a suitable process (such as photolithographic masking and etching) to form the first contact pads 207. However, any other suitable process may be utilized to form the first contact pads 207. The first contact pads may be formed to have a thickness of between about 0.5 µm and about 4 µm, such as about 1.45 µm.

The first passivation layer 211 may be formed on the first substrate 203 over the first metallization layers 205 and the first contact pads 207. The first passivation layer 211 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 211 may be formed through a process such as chemical vapor deposition (CVD), although any suitable process may be utilized, and may have a thickness between about 0.5 µm and about 5 µm, such as about 9.25 KÅ.

The first external connectors 209 may be formed to provide conductive regions for contact between the first contact pads 207 and, e.g., a redistribution layer 501 (not illustrated in FIG. 2 but illustrated and described below with respect to FIG. 5). In an embodiment the first external connectors 209 may be conductive pillars and may be formed by initially forming a photoresist (not shown) over the first passivation layer 211 to a thickness between about 5 µm to about 20 µm, such as about 10 µm. The photoresist may be patterned to expose portions of the first passivation layers through which the conductive pillars will extend. Once patterned, the photoresist may then be used as a mask to remove the desired portions of the first passivation layer 211, thereby exposing those portions of the underlying first contact pads 207 to which the first external connectors 209 will make contact.

The first external connectors 209 may be formed within the openings of both the first passivation layer 211 and the photoresist. The first external connectors 209 may be formed from a conductive material such as copper, although other conductive materials such as nickel, gold, or metal alloy, combinations of these, or the like may also be used. Additionally, the first external connectors 209 may be formed using a process such as electroplating, by which an electric current is run through the conductive portions of the first contact pads 207 to which the first external connectors 209 are desired to be formed, and the first contact pads 207 are immersed in a solution. The solution and the electric current deposit, e.g., copper, within the openings in order to fill and/or overfill the openings of the photoresist and the first passivation layer 211, thereby forming the first external connectors 209. Excess conductive material and photoresist outside of the openings of the first passivation layer 211 may then be removed using, for example, an ashing process, a chemical mechanical polish (CMP) process, combinations of these, or the like.

However, as one of ordinary skill in the art will recognize, the above described process to form the first external connectors 209 is merely one such description, and is not meant to limit the embodiments to this exact process. Rather, the described process is intended to be merely illustrative, as any suitable process for forming the first external connectors 209 may alternatively be utilized. All suitable processes are fully intended to be included within the scope of the present embodiments.

On an opposite side of the first substrate 203 than the first metallization layers 205, a first metal layer 213 may be placed in order to assist with removing heat from the first semiconductor device 201. In an embodiment the first metal layer 213 may be placed by initially applying a first glue layer 214 onto the first substrate 203. The first glue layer 214 may be an epoxy, although any suitable adhesive may also be utilized. The first glue layer 214 may be applied to a thickness of between about 0.5 µm and about 20 µm.

Once the first glue layer 214 has been applied to the first substrate 203, the first metal layer 213 may be applied. In an embodiment the first metal layer 213 may be a conductive material such as copper, although other suitable materials include Ti, TiN, and Ta. In an embodiment the first metal layer 213 may be a copper foil that has a first thickness of between about 3 µm and about 150 µm. The copper foil may be applied by contacting the copper foil to the first glue layer 214.

Adjacent to the first metal layer 213 a die attach film (DAF) 217 may be formed in order to assist in the attachment of the first semiconductor device 201 to the polymer layer 105. In an embodiment the die attach film 217 is an epoxy resin, a phenol resin, acrylic rubber, silica filler, or a combination thereof, and is applied using a lamination technique. However, any other suitable alternative material and method of formation may alternatively be utilized.

Figure 2B:
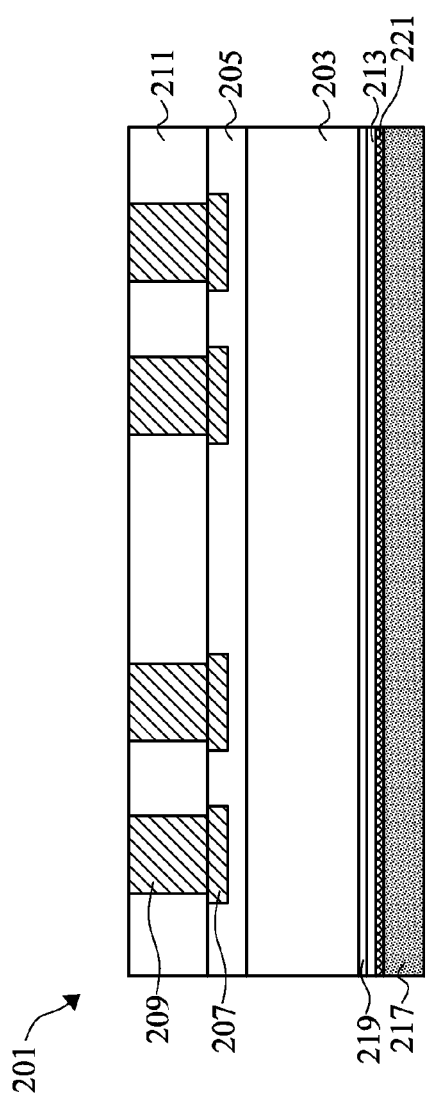

FIG. 2B illustrates another embodiment of the first semiconductor device 201 which utilizes the first metal layer 213. In this embodiment, the first metal layer 213 may be applied without the first glue layer 214. Optionally in this embodiment a first barrier layer 219 may be applied prior to the formation of the first metal layer 213 in order to prevent diffusion of the material of the first metal layer 213 into the underlying first substrate 203. In an embodiment the first barrier layer 219 may comprise a barrier material such as titanium, titanium nitride, combinations of these, or the like, and may be formed using a process such as chemical vapor deposition (CVD), physical vapor deposition (PVD), atomic layer deposition (ALD), or the like. The first barrier layer 219 may be formed to have a thickness of between about 0.1 µm and about 20 µm, such as about 0.5 µm.

Once the first barrier layer 219 has been formed, the first metal layer 213 may be formed over the first barrier layer 219. In this embodiment the first metal layer 213 may be formed using a deposition process such as physical vapor deposition (PVD), although any suitable deposition or placement process may alternatively be utilized. In an embodiment the first metal layer 213 may be formed to have a thickness of between about 0.02 µm and about 0.5 µm, such as about 0.3 µm, and the first metal layer 213 and the first barrier layer 219 (collectively) may have a thickness of between about 0.3 µm and about 15 µm.

Optionally, once the first metal layer 213 has been formed on the first barrier layer 219, a second barrier layer 221 may be formed over the first metal layer 213 in order to prevent the material of the first metal layer 213 (e.g. copper) from diffusing into adjacent structures. In an embodiment the second barrier layer 221 may be similar to the first barrier layer 219 (e.g., titanium or titanium nitride formed using CVD, PVD, or ALD), although it may alternatively be different.

In this embodiment, once either the first metal layer 213 or the second barrier layer 221 has been formed, the die attach film 217 may be applied in order to assist with the adhesion of the first semiconductor device 201 to the polymer layer 105. In an embodiment the die attach film 217 is as described above with respect to FIG. 2A.

Figure 3:
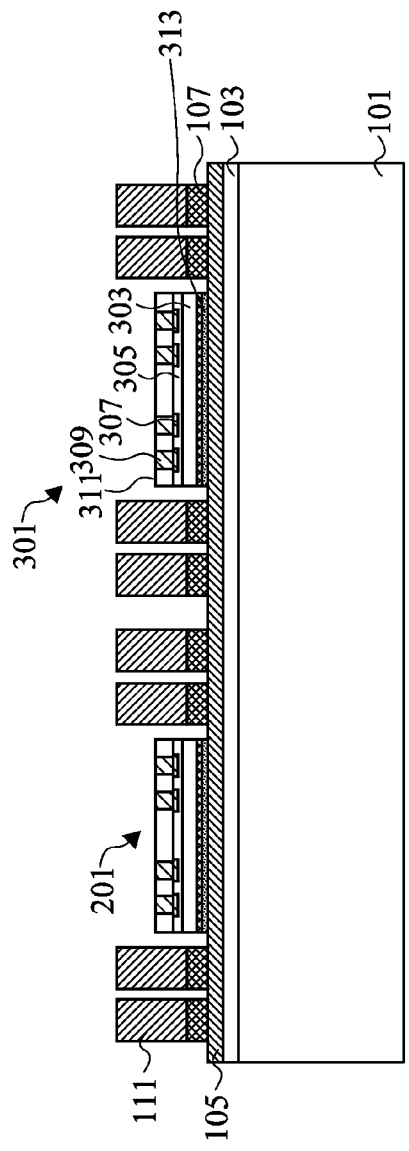
FIG. 3 illustrates a placement of the semiconductor device between the through vias, in accordance with some embodiments.

FIG. 3 illustrates a placement of the first semiconductor device 201 onto the polymer layer 105 along with a placement of a second semiconductor device 301. In an embodiment the second semiconductor device 301 may comprise a second substrate 303, second active devices (not individually illustrated), second metallization layers 305, second contact pads 307, a second passivation layer 311, and second external connectors 309. In an embodiment the second substrate 303, the second active devices, the second metallization layers 305, the second contact pads 307, the second passivation layer 311, and the second external connectors 309 may be similar to the first substrate 203, the first active devices, the first metallization layers 205, the first contact pads 207, the first passivation layer 211, and the first external connectors 209, although they may also be different.

Additionally, the second semiconductor device 301 may also have a second metal layer 313 formed along a side of the second substrate 303. In an embodiment the second metal layer 313 may be formed along with a second glue layer (not separately illustrated in FIG. 3) or along with a third barrier layer and fourth barrier layer (also not separately illustrated in FIG. 3). In an embodiment the second metal layer 313, the second glue layer, the third barrier layer, and the fourth barrier layer may be similar to the first metal layer 213, the first glue layer 214, the first barrier layer 219, and the second barrier layer 221 described above with respect to FIGS. 2A-2B, although they may be different.

In an embodiment the first semiconductor device 201 and the second semiconductor device 301 may be placed onto the polymer layer 105 using, e.g., a pick and place process. However, any other alternative method of placing the first semiconductor device 201 and the second semiconductor device 301.

Figure 4:
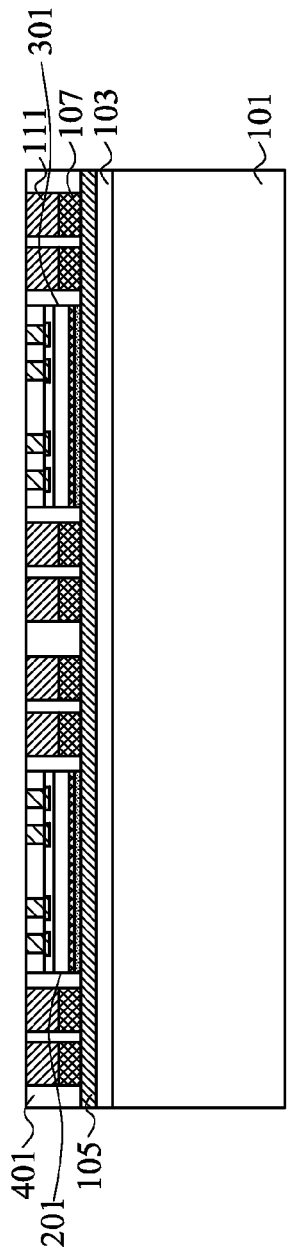
FIG. 4 illustrates an encapsulation of the semiconductor device and through vias, in accordance with some embodiments.

FIG. 4 illustrates an encapsulation of the vias 111, the first semiconductor device 201 and the second semiconductor device 301. The encapsulation may be performed in a molding device (not individually illustrated in FIG. 4), which may comprise a top molding portion and a bottom molding portion separable from the top molding portion. When the top molding portion is lowered to be adjacent to the bottom molding portion, a molding cavity may be formed for the carrier substrate 101, the vias 111, the first semiconductor device 201, and the second semiconductor device 301.

During the encapsulation process the top molding portion may be placed adjacent to the bottom molding portion, thereby enclosing the carrier substrate 101, the vias 111, the first semiconductor device 201, and the second semiconductor device 301 within the molding cavity. Once enclosed, the top molding portion and the bottom molding portion may form an airtight seal in order to control the influx and outflux of gasses from the molding cavity. Once sealed, an encapsulant 401 may be placed within the molding cavity. The encapsulant 401 may be a molding compound resin such as polyimide, PPS, PEEK, PES, a heat resistant crystal resin, combinations of these, or the like. The encapsulant 401 may be placed within the molding cavity prior to the alignment of the top molding portion and the bottom molding portion, or else may be injected into the molding cavity through an injection port.

Once the encapsulant 401 has been placed into the molding cavity such that the encapsulant 401 encapsulates the carrier substrate 101, the vias 111, the first semiconductor device 201, and the second semiconductor device 301, the encapsulant 401 may be cured in order to harden the encapsulant 401 for optimum protection. While the exact curing process is dependent at least in part on the particular material chosen for the encapsulant 401, in an embodiment in which molding compound is chosen as the encapsulant 401, the curing could occur through a process such as heating the encapsulant 401 to between about 100° C. and about 130° C., such as about 125° C. for about 60 sec to about 3000 sec, such as about 600 sec. Additionally, initiators and/or catalysts may be included within the encapsulant 401 to better control the curing process.

However, as one having ordinary skill in the art will recognize, the curing process described above is merely an exemplary process and is not meant to limit the current embodiments. Other curing processes, such as irradiation or even allowing the encapsulant 401 to harden at ambient temperature, may alternatively be used. Any suitable curing process may be used, and all such processes are fully intended to be included within the scope of the embodiments discussed herein.

FIG. 4 also illustrates a thinning of the encapsulant 401 in order to expose the vias 111, the first semiconductor device 201, and the second semiconductor device 301 for further processing. The thinning may be performed, e.g., using a mechanical grinding or chemical mechanical polishing (CMP) process whereby chemical etchants and abrasives are utilized to react and grind away the encapsulant 401, the first semiconductor device 201 and the second semiconductor device 301 until the vias 111, the first external connectors 209 (on the first semiconductor device 201), and the second external connectors 309 (on the second semiconductor device 301) have been exposed. As such, the first semiconductor device 201, the second semiconductor device 301, and the vias 111 may have a planar surface that is also planar with the encapsulant 401.

However, while the CMP process described above is presented as one illustrative embodiment, it is not intended to be limiting to the embodiments. Any other suitable removal process may alternatively be used to thin the encapsulant 401, the first semiconductor device 201, and the second semiconductor device 301 and expose the vias 111. For example, a series of chemical etches may be utilized. This process and any other suitable process may alternatively be utilized to thin the encapsulant 401, the first semiconductor device 201, and the second semiconductor device 301, and all such processes are fully intended to be included within the scope of the embodiments.

Optionally, after the encapsulant 401 has been thinned, the vias 111 and the first external connectors 209 may be recessed within the encapsulant 401. In an embodiment the vias 111 and the first external connectors 209 may be recessed using, e.g., an etching process that utilizes an etchant that is selective to the material of the vias 111 and the first external connectors 209 (e.g., copper). The vias 111 and the first external connectors 209 may be recessed to a depth of between about 20 µm and about 300 µm, such as about 180 µm.

Figure 5:
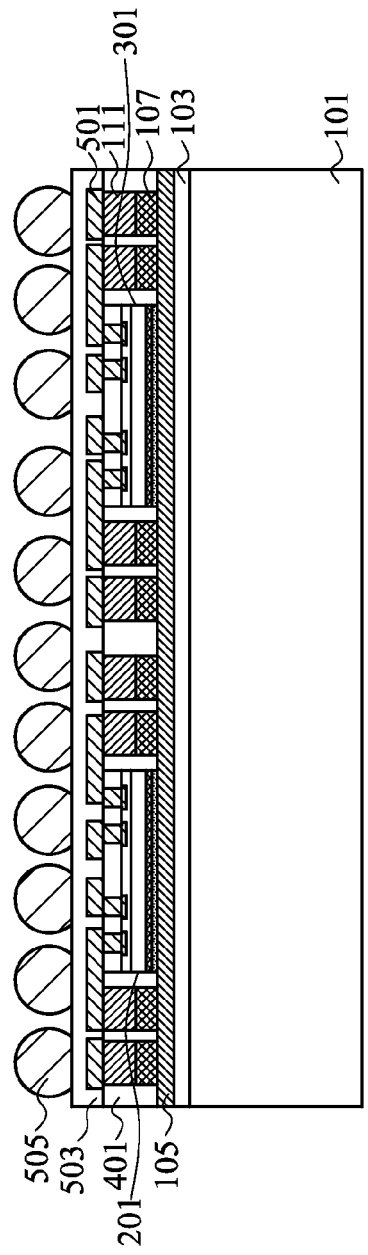
FIG. 5 illustrates formation of a redistribution layer and external connections, in accordance with some embodiments.

FIG. 5 illustrates a formation of a redistribution layer (RDL) 501 in order to interconnect the first semiconductor device 201, the second semiconductor device 301, the vias 111 and third external connectors 505. In an embodiment the RDL 501 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the RDL 501 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 5 µm. However, while the material and methods discussed are suitable to form the conductive material, these materials are merely exemplary. Any other suitable materials, such as AlCu or Au, and any other suitable processes of formation, such as CVD or PVD, may alternatively be used to form the RDL 501.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

FIG. 5 also illustrates a formation of a third passivation layer 503 over the RDL 501 in order to provide protection and isolation for the RDL 501 and the other underlying structures. In an embodiment the third passivation layer 503 may be polybenzoxazole (PBO), although any suitable material, such as polyimide or a polyimide derivative, may alternatively be utilized. The third passivation layer 503 may be placed using, e.g., a spin-coating process to a thickness of between about 5 μm and about 25 μm, such as about 7 μm, although any suitable method and thickness may alternatively be used.

Additionally, while FIG. 5 only illustrates a single RDL 501 and a single third passivation layer 503, this is done for clarity and is not intended to limit the embodiments. Rather, the above processes to form the single RDL 501 and the single third passivation layer 503 may be repeated one or more times to form a plurality of RDLs 501 and third passivation layers 503 as desired. Any suitable number of RDLs 501 may be utilized.

FIG. 5 further illustrates a formation of the third external connectors 505 to make electrical contact with the RDL 501. In an embodiment after the third passivation layer 503 has been formed, an opening may be made through the third passivation layer 503 by removing portions of the third passivation layer 503 to expose at least a portion of the underlying RDL 501. The opening allows for contact between the RDL 501 and the third external connectors 505. The opening may be formed using a suitable photolithographic mask and etching process, although any suitable process to expose portions of the RDL 501 may be used.

In an embodiment the third external connectors 505 may be a ball grid array and may be placed on the RDL 501 through the third passivation layer 503 and may comprise a eutectic material such as solder, although any suitable materials may alternatively be used. In an embodiment in which the third external connectors 505 are solder balls, the third external connectors 505 may be formed using a ball drop method to place the third external connectors 505 onto underbump metallizations (UBMs), such as a direct ball drop process. Alternatively, the solder balls may be formed by initially forming a layer of tin through any suitable method such as evaporation, electroplating, printing, solder transfer, and then performing a reflow is preferably performed in order to shape the material into the desired bump shape. Once the third external connectors 505 have been formed, a test may be performed to ensure that the structure is suitable for further processing.

Figure 6:
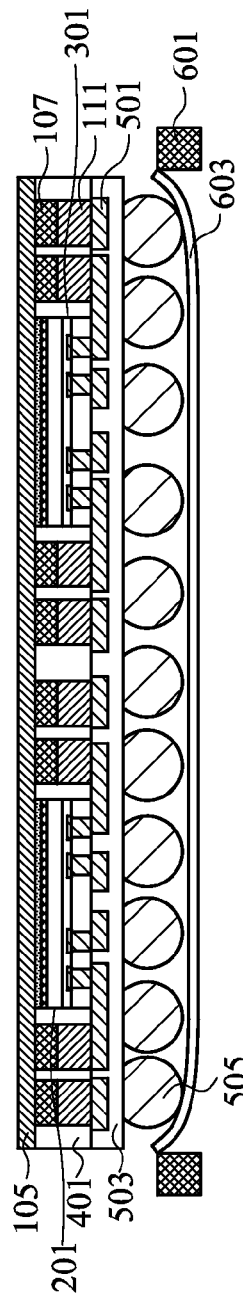
FIG. 6 illustrates a debonding of a carrier wafer, in accordance with some embodiments.

FIG. 6 illustrates a debonding of the carrier substrate 101 from the first semiconductor device 201 and the second semiconductor device 301. In an embodiment the third external connectors 505 and, hence, the structure including the first semiconductor device 201 and the second semiconductor device 301, may be attached to a ring structure 601. The ring structure 601 may be a metal ring intended to provide support and stability for the structure during and after the debonding process. In an embodiment the third external connectors 505, the first semiconductor device 201, and the second semiconductor device 301 are attached to the ring structure using, e.g., a ultraviolet tape 603, although any other suitable adhesive or attachment may alternatively be used.

Once the third external connectors 505 and, hence, the structure including the first semiconductor device 201 and the second semiconductor device 301 are attached to the ring structure 601, the carrier substrate 101 may be debonded from the structure including the first semiconductor device 201 and the second semiconductor device 301 using, e.g., a thermal process to alter the adhesive properties of the adhesive layer 103. In a particular embodiment an energy source such as an ultraviolet (UV) laser, a carbon dioxide ($CO_2$) laser, or an infrared (IR) laser, is utilized to irradiate and heat the adhesive layer 103 until the adhesive layer 103 loses at least some of its adhesive properties. Once performed, the carrier substrate 101 and the adhesive layer 103 may be physically separated and removed from the structure comprising the third external connectors 505, the first semiconductor device 201, and the second semiconductor device 301.

Figure 7A:
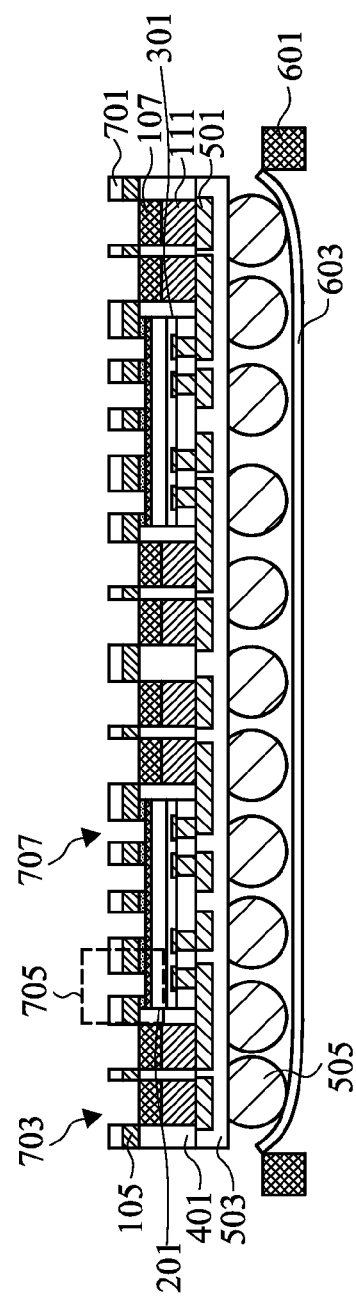
FIGS. 7A-7B illustrate an exposure of the metal layer, in accordance with some embodiments.

FIG. 7A illustrates an optional placement of a backside protection layer 701 over the polymer layer 105. In an embodiment the backside protection layer 701 may be a protective material such as a Solder Resistance (SR), Lamination Compound (LC), or Ajinomoto build-up film (ABF). In an embodiment the backside protection layer 701 may be applied using a lamination technique to a thickness of between about 10 μm and about 80 μm, such as about 25 μm.

FIG. 7A also illustrates that, once the backside protection layer 701 has been placed, the backside protection layer 701 and the polymer layer 105 may be patterned in order to expose the vias 111 and desired portions of the first metal layer 213 and the second metal layer 313. In an embodiment the backside protection layer 701 and the polymer layer 105 may be patterned using, e.g., a laser drilling method, by which a laser is directed towards those portions of the polymer layer 105 which are desired to be removed in order to expose the underlying vias 111, the first metal layer 213, and the second metal layer 313. During the laser drilling process the drill energy may be in a range from 0.1 mJ to about 30 mJ, and a drill angle of about 0 degree (perpendicular to the backside protection layer 701) to about 85 degrees to normal of the backside protection layer 701. In an embodiment the patterning may be formed to form first openings 703 over the vias 111 to have a first width of between about 100 μm and about 300 μm, such as about 200 μm, and also to form second openings 707 over the first semiconductor device 201 to have a second width of between about 10 μm and about 300 μm, such as about 150 μm.

In another embodiment, the backside protection layer 701 and the polymer layer 105 may be patterned by initially applying a photoresist (not individually illustrated in FIG. 7A) to the backside protection layer 701 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the backside protection layer 701 and the polymer layer 105 are removed with, e.g., a dry etch process. However, any other suitable method for patterning the backside protection layer 701 and the polymer layer 105 may be utilized.

Optionally, a cleaning process may be utilized after the laser drill process in order to remove any residual material left behind by the laser drill process. In an embodiment the cleaning process may be a plasma clean process which may also remove a portion of the exposed surfaces of the backside protection layer 701 and the polymer layer 105. In an embodiment, the plasma clean process is performed using an oxygen plasma, or the like, in an inert atmosphere such a nitrogen, argon, or the like.

Figure 7B:
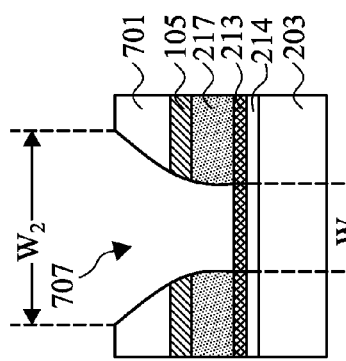

FIG. 7B illustrates a close-up view of one of the second openings 707 formed over the first semiconductor device 201 as illustrated by the dashed line labeled 705 in FIG. 7A. As can be seen, the first substrate 203, the first metal layer 213 (along with either the first glue layer 214 or the first barrier layer 219), the DAF 217, the polymer layer 105 and the backside protection layer 701 are stacked, and the second opening 707 extends through the backside protection layer 701, the polymer layer 105 and the DAF 217, but stops on the first metal layer 213, thereby exposing the first metal layer 213 on the backside of the first substrate 203.

Additionally, the second opening 707 has a funnel shape. In an embodiment the second opening 707 has a first width $W_1$ of between about 20 µm and about 300 µm, such as about 100 µm, adjacent to the first metal layer 213. Additionally, the second opening 707 has a second width $W_2$ of between about 50 µm and about 320 µm, such as about 120 µm, at the top of the second opening 707. However, any suitable dimensions may be utilized.

By exposing portions of the first metal layer 213 along a backside of the first substrate 203, a thermal path may be formed in connection with the first semiconductor device 201 through the DAF 217, the polymer layer 105 and the backside protection layer 701 without the need for another redistribution layer and its associated passivation layer and bond pad simply to remove heat from the first semiconductor device 201. As such, the overall process may be simplified by avoiding the processes associated with a redistribution layer and bond pads. This allows for a more efficient process to provide a thermal path to remove heat generated by the first semiconductor device 201.

Figure 8:
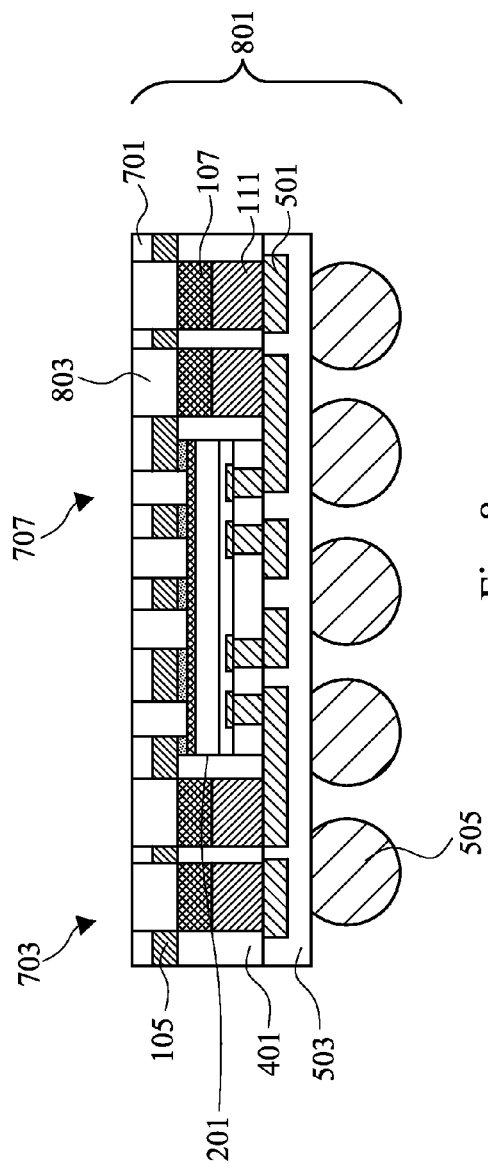
FIG. 8 illustrates a singulation of the semiconductor device, in accordance with some embodiments.

FIG. 8 illustrates a singulation of the structure to form a first package 801. In an embodiment the singulation may be performed by using a saw blade (not shown) to slice through the encapsulant 401 and the polymer layer 105 between the vias 111, thereby separating one section from another to form the first package 801 with the first semiconductor device 201. However, as one of ordinary skill in the art will recognize, utilizing a saw blade to singulate the first package 801 is merely one illustrative embodiment and is not intended to be limiting. Alternative methods for singulating the first package 801, such as utilizing one or more etches to separate the first package 801, may alternatively be utilized. These methods and any other suitable methods may alternatively be utilized to singulate the first package 801.

FIG. 8 additionally illustrates a placement of a thermally conductive protective layer 803 within the first openings 703 and the second opening 707 over the first semiconductor device 201 in order to protect the now exposed first metal layer 213 and vias 111. In an embodiment the thermally conductive protective layer 803 may comprise a thermally conductive material such as solder paste or an oxygen solder protection (OSP), although any suitable material may alternatively be utilized. In an embodiment the thermally conductive protective layer 803 may be applied using a stencil, although any suitable method of application may alternatively be utilized.

Figure 9:
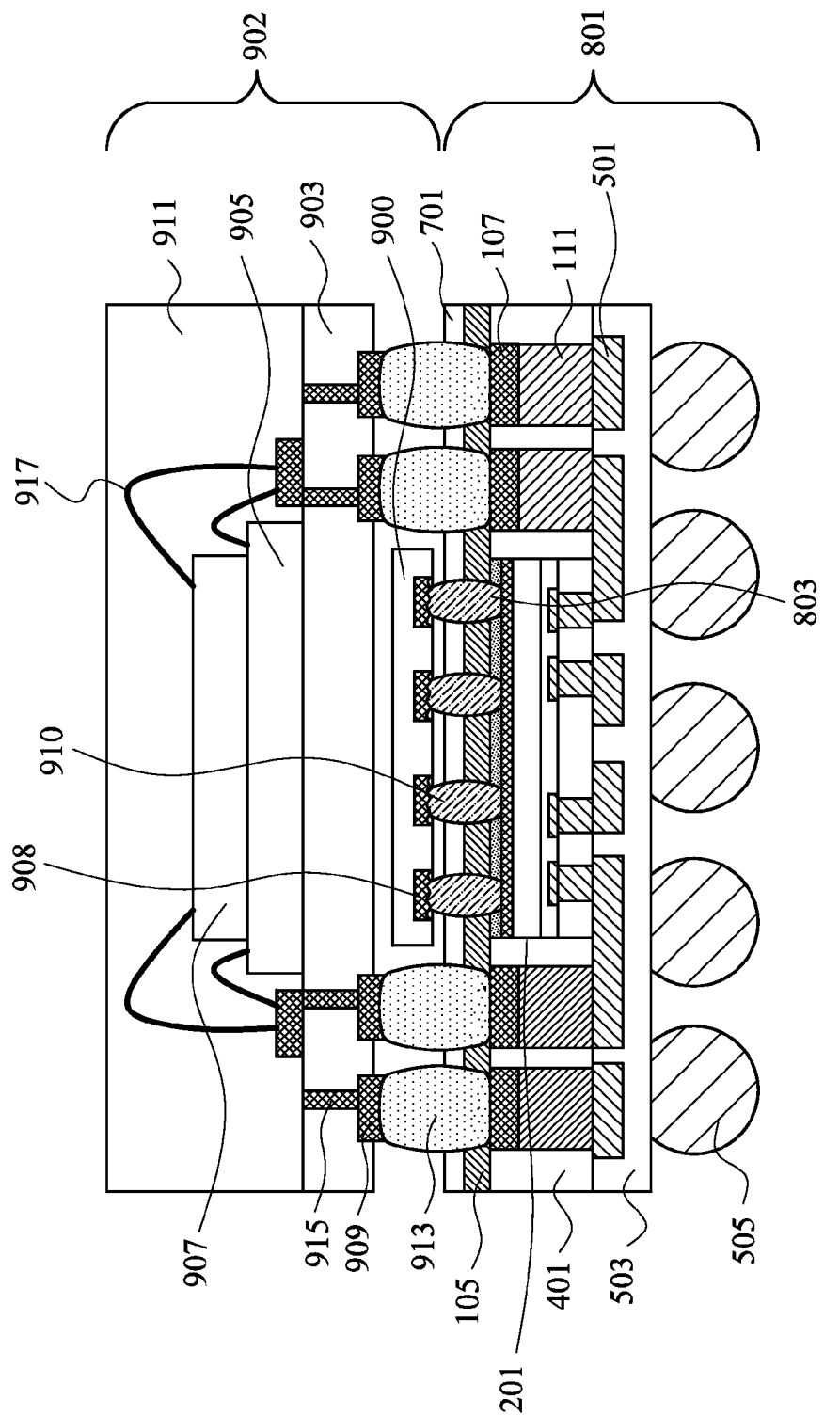
FIG. 9 illustrates a bonding of a thermal die, in accordance with some embodiments.

FIG. 9 illustrates a placement of a thermal die 900 in thermal connection with the first metal layer 213 through the thermally conductive protective layer 803. In an embodiment the thermal die 900 comprises thermally conductive material that receives heat from the first semiconductor device 201 through, e.g., third contact pads 909, and transmits the heat away from the first semiconductor device 201. In an embodiment the thermal die 900 may be passive (with only passive transfer of thermal energy) or may comprise an active transfer system which circulates a cooling medium such as water through the thermal die 900 in order to actively move heat away from the first semiconductor device 201.

Additionally, while the thermal die 900 may comprise materials and structure solely designed for the purpose of removing heat, embodiments are not intended to be limited as such. Rather, in other embodiments the thermal die 900 may comprise active devices (such as transistors) and passive devices (such as resistors and capacitors) which may work to provide a desired functionality along with the desired removal of heat. Any suitable combination of structures may be utilized with the thermal die 900 in order to remove heat from the first semiconductor device 201.

To bond the thermal die 900 to the first semiconductor device 201, fourth external connections 910 may be formed on the third contact pads 909. In an embodiment the fourth external connections 910 may be contact bumps such as a ball grid array, microbumps, or controlled collapse chip connection (C4) bumps and may comprise a material such as tin, or other suitable materials, such as silver or copper. In an embodiment in which the fourth external connections 910 are tin solder bumps, the fourth external connections 910 may be formed by initially forming a layer of tin through any suitable method such as evaporation, electroplating, printing, solder transfer, ball placement, etc, to a thickness of, e.g., about 100 µm. Once a layer of tin has been formed on the structure, a reflow is performed in order to shape the material into the desired bump shape.

Once the fourth external connections 910 have been formed, the fourth external connections 910 are aligned with and placed into physical contact with the thermally conductive protective layer 803 over the first metal layer 213, and a bonding is performed. For example, in an embodiment in which the fourth external connections 910 are solder bumps, the bonding process may comprise a reflow process whereby the temperature of the fourth external connections 910 is raised to a point where the fourth external connections 910 will liquefy and flow, thereby bonding the thermal die 900 to the thermally conductive protective layer 803 once the fourth external connections 910 resolidifies.

FIG. 9 also illustrates that once the thermal die 900 has been placed, a second package 902 may be bonded to the vias 111. The second package 902 may comprise a third substrate 903, a third semiconductor device 905, a fourth semiconductor device 907 (bonded to the third semiconductor device 905), third contact pads 909, a second encapsulant 911, and fifth external connections 913. In an embodiment the third substrate 903 may be, e.g., a packaging substrate comprising internal interconnects (e.g., through substrate vias 915) to electrically connect the third semiconductor device 905 to the vias 111.

Alternatively, the third substrate 903 may be an interposer used as an intermediate substrate to connect the third semiconductor device 905 to the vias 111. In this embodiment the third substrate 903 may be, e.g., a silicon substrate, doped or undoped, or an active layer of a silicon-on-insulator (SOI) substrate. However, the third substrate 903 may alternatively be a glass substrate, a ceramic substrate, a polymer substrate, or any other substrate that may provide a suitable protection and/or interconnection functionality. These and any other suitable materials may alternatively be used for the third substrate 903.

The third semiconductor device 905 may be a semiconductor device designed for an intended purpose such as being a logic die, a central processing unit (CPU) die, a memory die (e.g., a DRAM die), combinations of these, or the like. In an embodiment the third semiconductor device 905 comprises integrated circuit devices, such as transistors, capacitors, inductors, resistors, first metallization layers (not shown), and the like, therein, as desired for a particular functionality. In an embodiment the third semiconductor device 905 is designed and manufactured to work in conjunction with or concurrently with the first semiconductor device 201.

The fourth semiconductor device 907 may be similar to the third semiconductor device 905. For example, the fourth semiconductor device 907 may be a semiconductor device designed for an intended purpose (e.g., a DRAM die) and comprising integrated circuit devices for a desired functionality. In an embodiment the fourth semiconductor device 907 is designed to work in conjunction with or concurrently with the first semiconductor device 201 and/or the third semiconductor device 905.

The fourth semiconductor device 907 may be bonded to the third semiconductor device 905. In an embodiment the fourth semiconductor device 907 is only physically bonded with the third semiconductor device 905, such as by using an adhesive. In this embodiment the fourth semiconductor device 907 and the third semiconductor device 905 may be electrically connected to the third substrate 903 using, e.g., wire bonds 917, although any suitable electrical bonding may be alternatively be utilized.

Alternatively, the fourth semiconductor device 907 may be bonded to the third semiconductor device 905 both physically and electrically. In this embodiment the fourth semiconductor device 907 may comprise third external connections (not separately illustrated in FIG. 9) that connect with fourth external connections (also not separately illustrated in FIG. 9) on the third semiconductor device 905 in order to interconnect the fourth semiconductor device 907 with the third semiconductor device 905.

The third contact pads 909 may be formed on the third substrate 903 to form electrical connections between the third semiconductor device 905 and, e.g., the fifth external connections 913. In an embodiment the third contact pads 909 may be formed over and in electrical contact with electrical routing (such as through substrate vias 915) within the third substrate 903. The third contact pads 909 may comprise aluminum, but other materials, such as copper, may alternatively be used. The third contact pads 909 may be formed using a deposition process, such as sputtering, to form a layer of material (not shown) and portions of the layer of material may then be removed through a suitable process (such as photolithographic masking and etching) to form the third contact pads 909. However, any other suitable process may be utilized to form the third contact pads 909. The third contact pads 909 may be formed to have a thickness of between about 0.5 μm and about 4 μm, such as about 1.45 μm.

The second encapsulant 911 may be used to encapsulate and protect the third semiconductor device 905, the fourth semiconductor device 907, and the third substrate 903. In an embodiment the second encapsulant 911 may be a molding compound and may be placed using a molding device (not illustrated in FIG. 9). For example, the third substrate 903, the third semiconductor device 905, and the fourth semiconductor device 907 may be placed within a cavity of the molding device, and the cavity may be hermetically sealed. The second encapsulant 911 may be placed within the cavity either before the cavity is hermetically sealed or else may be injected into the cavity through an injection port. In an embodiment the second encapsulant 911 may be a molding compound resin such as polyimide, PPS, PEEK, PES, a heat resistant crystal resin, combinations of these, or the like.

Once the second encapsulant 911 has been placed into the cavity such that the second encapsulant 911 encapsulates the region around the third substrate 903, the third semiconductor device 905, and the fourth semiconductor device 907, the second encapsulant 911 may be cured in order to harden the second encapsulant 911 for optimum protection. While the exact curing process is dependent at least in part on the particular material chosen for the second encapsulant 911, in an embodiment in which molding compound is chosen as the second encapsulant 911, the curing could occur through a process such as heating the second encapsulant 911 to between about 100° C. and about 130° C., such as about 125° C. for about 60 sec to about 3000 sec, such as about 600 sec. Additionally, initiators and/or catalysts may be included within the second encapsulant 911 to better control the curing process.

However, as one having ordinary skill in the art will recognize, the curing process described above is merely an exemplary process and is not meant to limit the current embodiments. Other curing processes, such as irradiation or even allowing the second encapsulant 911 to harden at ambient temperature, may alternatively be used. Any suitable curing process may be used, and all such processes are fully intended to be included within the scope of the embodiments discussed herein.

In an embodiment the fifth external connections 913 may be formed to provide an external connection between the third substrate 903 and, e.g., the vias 111. The fifth external connections 913 may be contact bumps such as a ball grid array, microbumps, or controlled collapse chip connection (C4) bumps and may comprise a material such as tin, or other suitable materials, such as silver or copper. In an embodiment in which the fifth external connections 913 are tin solder bumps, the fifth external connections 913 may be formed by initially forming a layer of tin through any suitable method such as evaporation, electroplating, printing, solder transfer, ball placement, etc, to a thickness of, e.g., about 100 μm. Once a layer of tin has been formed on the structure, a reflow is performed in order to shape the material into the desired bump shape.

Once the fifth external connections 913 have been formed, the fifth external connections 913 are aligned with and placed into physical contact with the thermally conductive protective layer 803 over the vias 111, and a bonding is performed. For example, in an embodiment in which the fifth external connections 913 are solder bumps, the bonding process may comprise a reflow process whereby the temperature of the fifth external connections 913 is raised to a point where the fifth external connections 913 will liquefy and flow, thereby bonding the second package 902 to the thermally conductive protective layer 803 once the fifth external connections 913 resolidifies.

By forming the first metal layer 213 along a backside of the first semiconductor device 201, and then forming an opening through the backside layers to bond a thermal die to the first metal layer 213, a thermal pathway may be formed away from the first semiconductor device 201. As such, heat may be quickly and efficiently removed from the first semiconductor device 201 without the complexity and cost of forming redistribution layers, passivation layers associated with the redistribution layers, and contact pads on the backside of the first semiconductor device 201 for the sole sake of removing heat. As such, a simpler and more cost efficient product may be manufactured.

Figure 10:
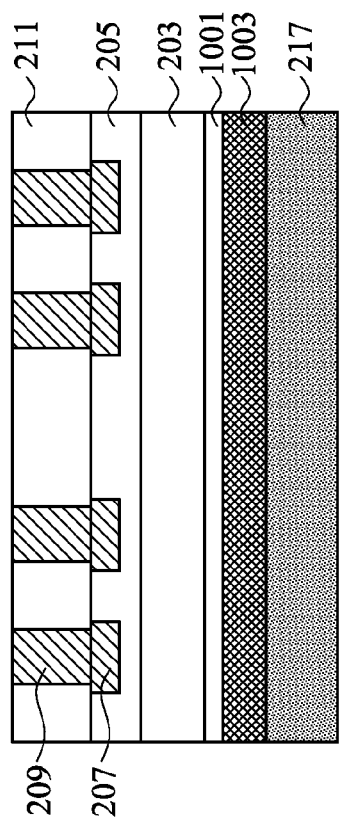
FIG. 10 illustrates another embodiment in which a seed layer is utilized on the back side of the semiconductor device, in accordance with some embodiments.

FIG. 10 illustrates another embodiment in which the first semiconductor device 201 is utilized. In this embodiment the first semiconductor device 201 may still comprise the first substrate 203, the first active devices (not illustrated in FIG. 9), the first metallization layers 205, the first contact pads 207, the first passivation layer 211 and the first external connectors 209.

In this embodiment, however, a dual seed layer, e.g., a second seed layer 1001 and a third seed layer 1003 is formed over the backside of the first substrate 203. In an embodiment the second seed layer 1001 may comprise a thermally conductive material such as titanium, copper, tantalum, titanium nitride, nickel, combinations of these, or the like. In an embodiment the second seed layer 1001 may be formed using a deposition process such as CVD, PVD, or ALD, although any suitable method of formation or placement may alternatively be utilized. The second seed layer 1001 may be formed to a thickness of between about 0 Å and about 2000 Å.

The third seed layer 1003 may also be a thermally conductive material such as titanium, copper, tantalum, titanium nitride, nickel, combinations of these, or the like, and may be the same material or a different material than the second seed layer 1001. In an embodiment the third seed layer may be formed using CVD, PVD, or ALD, although any suitable deposition or placement process may alternatively be utilized, and may be formed to a thickness of between about 500 Å to about 10,000 Å. In a particular embodiment the second seed layer 1001 may be titanium with a thickness of about 500 Å and the third seed layer 1003 may be copper with a thickness of about 3,000 Å.

Once the second seed layer 1001 and the third seed layer 1003 have been formed or placed on the first substrate 203, the DAF 21 may be placed over the third seed layer 1003. In an embodiment the DAF 217 may be materials as described above with respect to FIG. 2. However, any suitable material may be used to attach the first semiconductor device 201 to the polymer layer 105.

Figure 11:
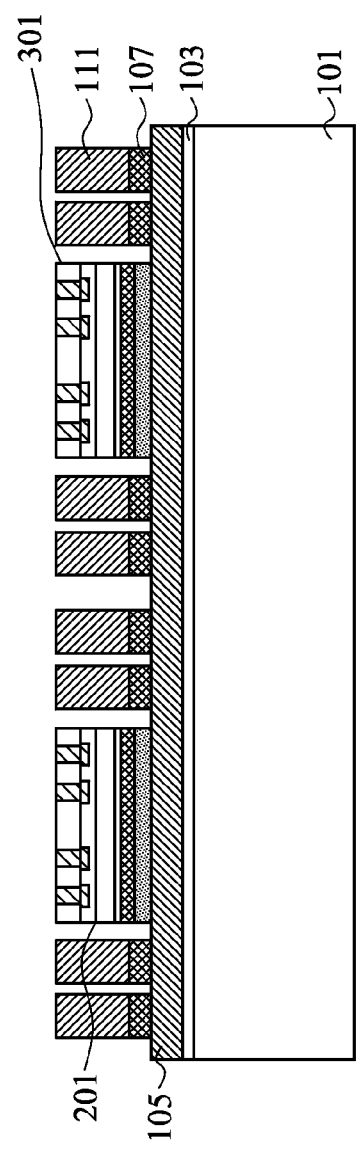
FIG. 11 illustrates a placement of the semiconductor device between the vias, in accordance with some embodiments.

FIG. 11 illustrates a placement of the first semiconductor device 201 and the second semiconductor device 301 (which may also have a dual seed layer) onto the polymer layer 105. In an embodiment the polymer layer 105 is located over the carrier substrate 101 and the adhesive layer 103, and the vias 111 are also located on the polymer layer 105 as described above with respect to FIG. 1. The placement may be performed by a pick and place routine, with the DAF 217 adhering the first semiconductor device 201 and the second semiconductor device 301 to the polymer layer 105.

Figure 12:
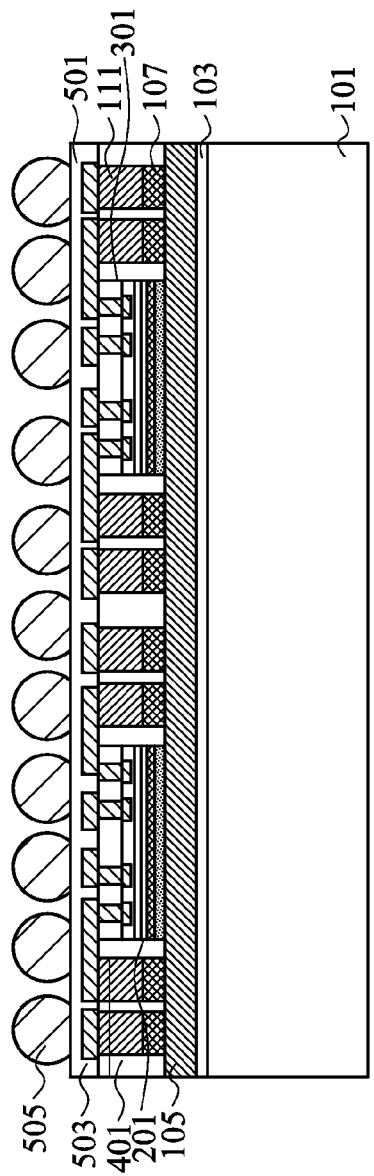
FIG. 12 illustrates an encapsulation and formation of a redistribution layer, in accordance with some embodiments.

FIG. 12 illustrates the encapsulation of the first semiconductor device 201 and the second semiconductor device 301 with the encapsulant 401. In an embodiment the encapsulation may be performed as described above with respect to FIG. 4. For example, the first semiconductor device 201 and the second semiconductor device 301 are placed into a molding chamber, the encapsulant 401 is injected into the molding chamber, and the encapsulant 401 is then cured. However, any suitable encapsulating process or method may alternatively be utilized.

FIG. 12 also illustrates a thinning of the encapsulant 401 and a formation of the RDL 501, the third passivation layer 503, and the third external connectors 505. In an embodiment the thinning of the encapsulant 401, the formation of the RDL 501, the third passivation layer 503, and the third external connectors 505 may be performed as described above with respect to FIGS. 4-5. However, any suitable methods and materials may alternatively be utilized.

Figure 13:
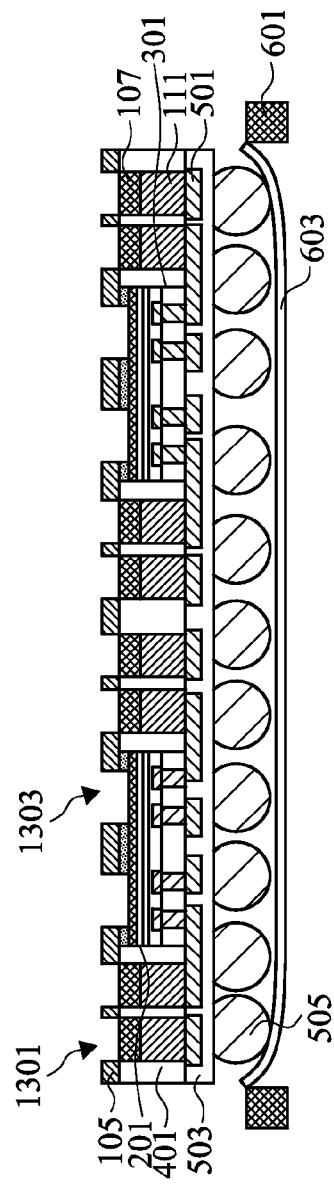
FIG. 13 illustrates an exposure of the seed layer in accordance with some embodiments.

FIG. 13 illustrates an attachment of the first semiconductor device 201 and the second semiconductor device 301 to the ring structure 601 and a debonding of the carrier substrate 101 from the first semiconductor device 201 and the second semiconductor device 301. In an embodiment the first semiconductor device 201 and the second semiconductor device 301 may be attached to the ring structure 601 and the carrier substrate 101 removed as described above with respect to FIG. 6, although any suitable method of attaching and removing may alternatively be utilized.

FIG. 13 additionally illustrates formation of third openings 1301 and fourth openings 1303 through the polymer layer 105 without the backside protection layer 701. In an embodiment the third openings 1301 and the fourth openings 1303 may be formed using, e.g., a laser drilling method, by which a laser is directed towards those portions of the polymer layer 105 which are desired to be removed in order to expose the underlying vias 111 and portions of the third seed layer 1003. In an embodiment the patterning may be formed to form the third openings 1301 over the vias 111 to have a first width of between about 100 μm and about 300 μm, such as about 200 μm, and also to form fourth openings 1303 over the first semiconductor device 201 to have a second width of between about 15 μm and about 30 μm, such as about 20 μm.

Figure 14:
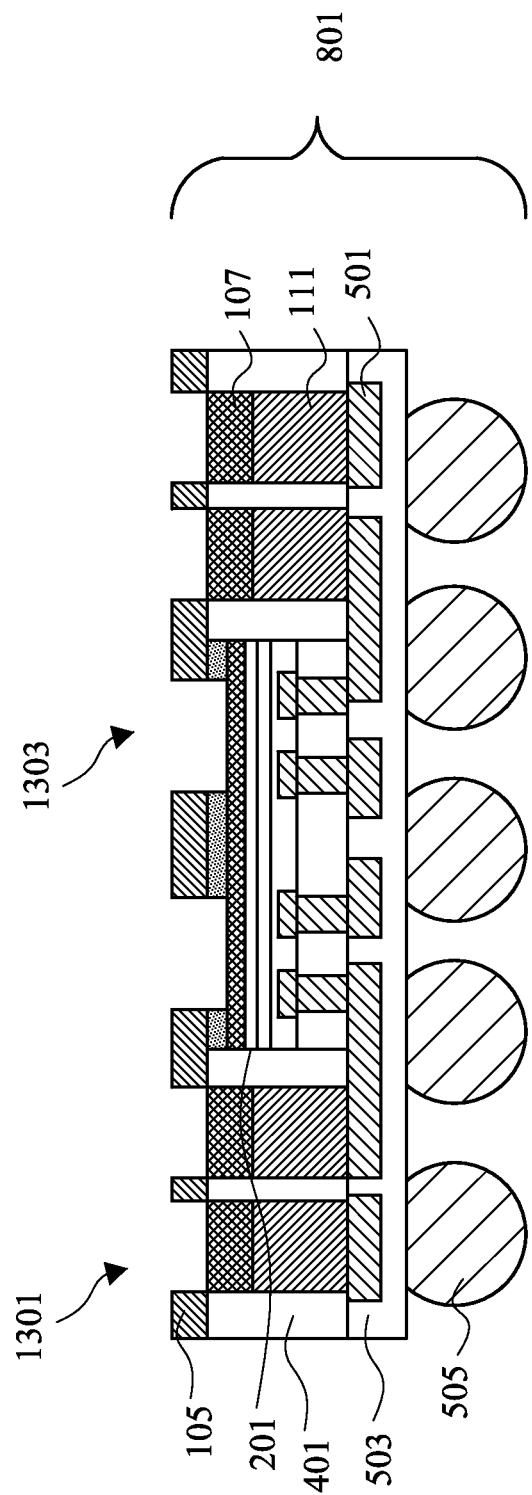
FIG. 14 illustrates a singulation of the semiconductor device, in accordance with some embodiments.

FIG. 14 illustrates a singulation of the first semiconductor device 201 from the second semiconductor device 301 to form the first package 801. In an embodiment the first semiconductor device 201 may be singulated from the second semiconductor device 301 as described above with respect to FIG. 8. For example, a saw blade may be utilized to singulate the first semiconductor device 201 from the second semiconductor device 301. However, any suitable alternative method may alternatively be utilized.

Optionally at this point, the thermally conductive protective layer 803 may be applied within the third openings 1301 and the fourth openings 1303. In an embodiment the thermally conductive protective layer 803 may be applied as described above with respect to FIG. 8. However, any suitable method may alternatively be utilized.

Figure 15:
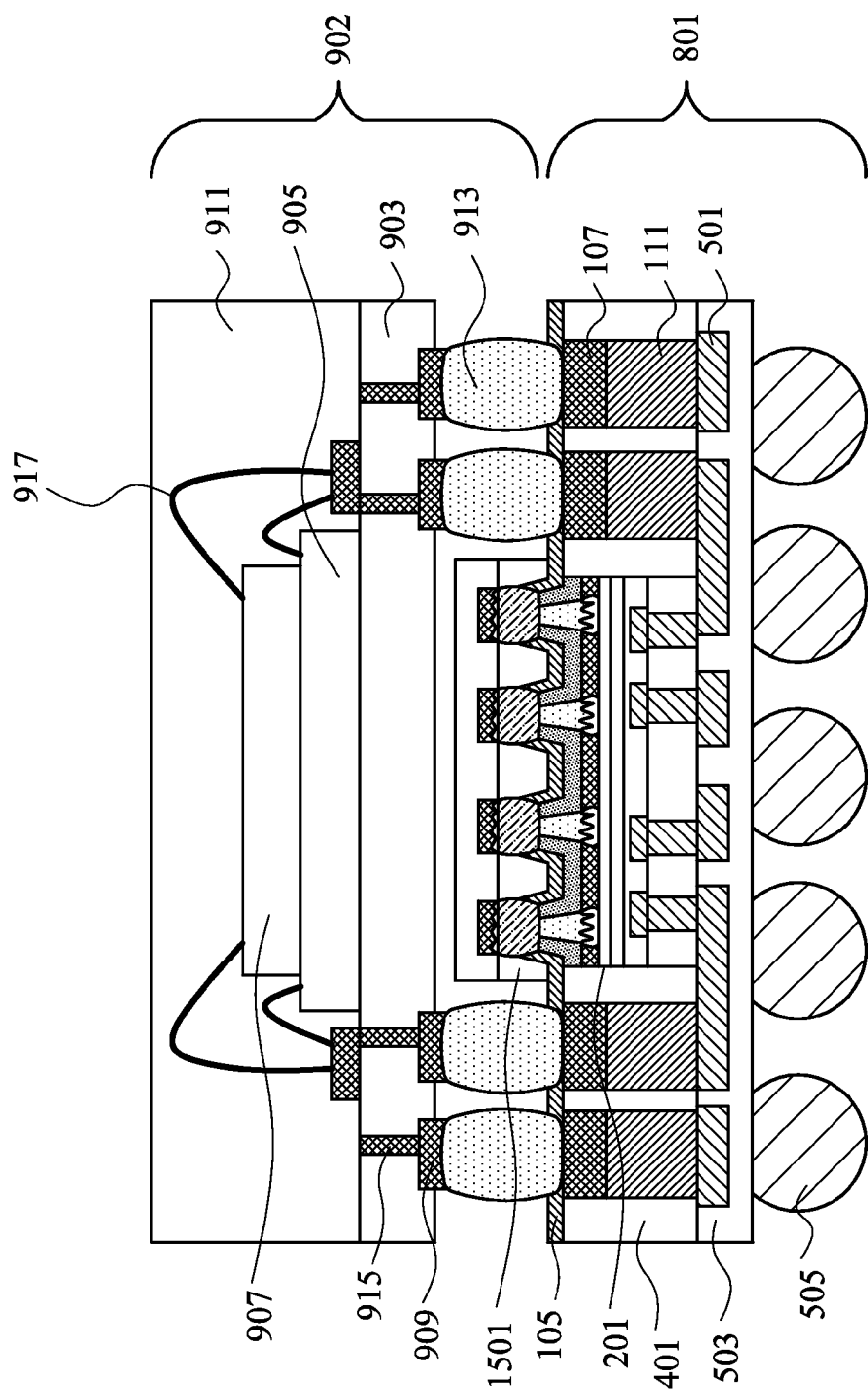
FIG. 15 illustrates a bonding of the thermal die, in accordance with some embodiments.

FIG. 15 illustrates that, once the thermally conductive protective layer 803 has been applied, the thermal die 900 and the second package 902 may be bonded to the first semiconductor device 201 and the vias 111, respectively. In an embodiment the thermal die 900 and the second package 902 may be bonded as described above with respect to FIG. 9. For example, the thermal die 900 may be aligned with the fourth openings 1303 through the polymer layer 105. Similarly, the second package 902 may be aligned with the third openings 1301 through the polymer layer 105. Once aligned, a reflow process may be performed in order to bond the thermal die 900 and the third semiconductor device 905 to the first package 801. However, any suitable method of bonding the thermal die 900 and the third semiconductor device 905 may alternatively be utilized.

Optionally, after the thermal die 900 has been bonded, an underfill material 1501 may be dispensed between the thermal die 900 and the first package 801. In an embodiment the underfill material 1501 is a protective material used to cushion and support the thermal die 900 and the first package 801 from operational and environmental degradation, such as stresses caused by the generation of heat during operation. The underfill material 1501 may be injected or otherwise formed in the space between the thermal die 900 and the first package 801 and may, for example, comprise a liquid epoxy that is dispensed between the thermal die 900 and the first package 801, and then cured to harden.

Figure 16A:
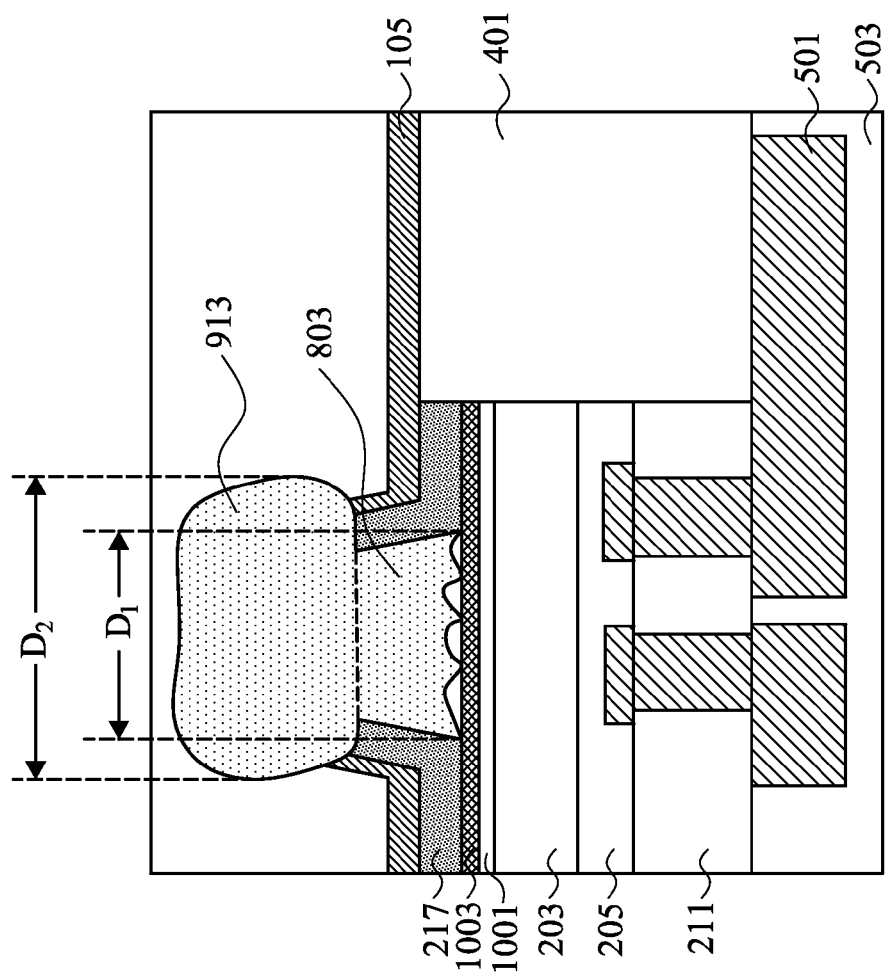
FIGS. 16A-16B illustrate embodiments of a joint, in accordance with some embodiments.

FIG. 16A illustrates a close up view of the joint between the third seed layer 1003 and the thermally conductive protective layer 803, along with the fifth external connections 913, in the embodiment illustrated in FIG. 15. In an embodiment the bonded fifth external connections 913/thermally conductive protective layer 803 along the joint after the bonding reflow has a first diameter $D_1$ and the fifth external connections 913 over the polymer layer 105 after the bonding has a second diameter $D_2$ that is greater than the first diameter $D_1$. In an embodiment the first diameter $D_1$ may be between about 20 μm and about 150 μm, such as about 100 μm, while the second diameter $D_2$ may be between about 50 μm and about 200 μm, such as about 120 μm. To achieve the structure of FIG. 16A, the critical dimension of the opening through the DAF 217 is less than the size of the ball, and the ball size may be between about 200 μm and about 400 μm, and an underbump metallization may be between about 0.03 μm and about 0.5 μm.

Figure 16B:
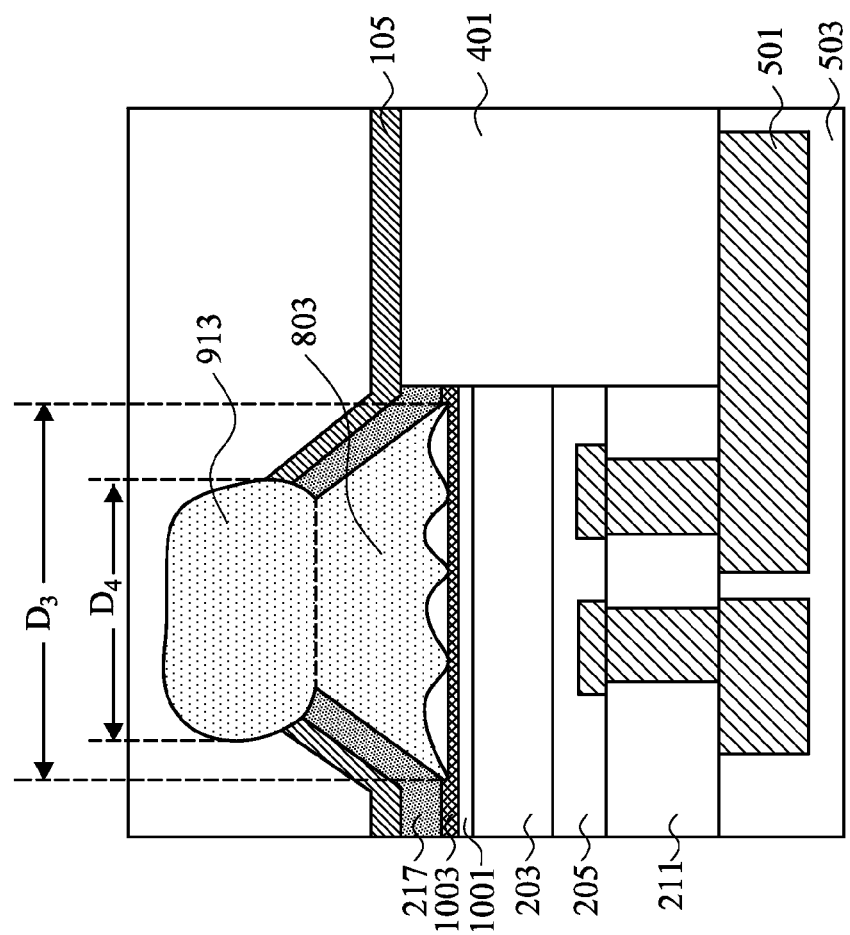

FIG. 16B illustrates another embodiment in which the joint along the second seed layer 1003 has a third diameter $D_3$ that is larger than a fourth diameter $D_4$ of the fifth external connections 913 over the polymer layer 105. In an embodiment the third diameter $D_3$ may be between about 100 μm and about 300 μm, such as about 250 μm, while the fourth diameter $D_4$ may be between about 50 μm and about 150 μm, such as about 120 μm. To achieve the structure of FIG. 16B, the critical dimension of the opening through the DAF 217 is less than the size of the ball, and the ball size may be between about 20 μm and about 200 μm, and an underbump metallization may be between about 0.03 μm and about 0.5 μm.

By forming the joint as described above, a larger surface area for heat transfer out of the first semiconductor device 201 may be achieved. With a larger surface area, a larger amount of heat may be more easily removed from the first semiconductor device 201 and removed from the overall device. This leads to a more efficient operation of the first semiconductor device 201 and less heat induced failures during operation.

In accordance with an embodiment, a semiconductor device comprising a first semiconductor substrate with first external connections located on a first side of the first semiconductor substrate is provided. A first plurality of through vias extend through an encapsulant, wherein the encapsulant separates the first semiconductor substrate from the first plurality of through vias, and a metal layer covers a second side of the first semiconductor substrate opposite the first side, wherein the metal layer does not extend over the first plurality of through vias.

In accordance with another embodiment, a semiconductor device comprising a first semiconductor substrate with a first side and a second side opposite the second side is provided. First electrical contacts are under the first side and a metal layer extends over the second side. A first through via has a first height greater than a distance from the first electrical contact to the metal layer. An encapsulant extends between the first through via and the first semiconductor substrate. A first reflowable material is in physical contact with the metal layer. A polymer layer is over the metal layer and at least partially over a portion of the first reflowable material, and a second reflowable material in physical contact with the first reflowable material and extending away from the first semiconductor substrate further than the polymer layer.

In accordance with yet another embodiment, a method of manufacturing a semiconductor device comprising placing a metal layer on a first side of a first semiconductor substrate, wherein the first semiconductor substrate has active devices located on a second side opposite the first side is provided. The first semiconductor substrate is placed next to a through via and the first semiconductor substrate, the metal layer, and the through via are encapsulated. The encapsulant is thinned to expose the through via and the metal layer is exposed through a polymer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first semiconductor substrate with first external connections located on a first side of the first semiconductor substrate;
   a first plurality of through vias extending through an encapsulant, wherein the encapsulant separates the first semiconductor substrate from the first plurality of through vias;
   a metal layer covering a second side of the first semiconductor substrate opposite the first side, wherein the metal layer does not extend over the first plurality of through vias;
   a die attach film disposed on the metal layer;
   a polymer layer disposed on the die attach film;
   a backside protection layer disposed on the polymer layer; and
   a thermally conductive protective feature extending through the backside protection layer, the polymer layer, the die attach film such that the thermally conductive protective feature physically contacts the metal layer, the thermally conductive protective feature formed of a different material than the metal layer, wherein the thermally conductive protective feature has a first portion having a first width a second portion having a second width that is different than the first width.

2. The semiconductor device of claim 1, further comprising a glue layer between the first semiconductor substrate and the metal layer.

3. The semiconductor device of claim 1, further comprising a barrier layer between the first semiconductor substrate and the metal layer, and
   wherein the metal layer has a third side facing the second side of the first semiconductor substrate and an opposing fourth side, wherein the barrier layer extends from the third side towards the second side of the first semiconductor substrate.

4. The semiconductor device of claim 1, wherein the die attach film is disposed directly on the metal layer; wherein the polymer layer is disposed directly on the die attach film; wherein the backside protection layer is disposed directly on the polymer layer.

5. The semiconductor device of claim 4, wherein the second width is further away from the metal layer than the first width.

6. The semiconductor device of claim 1, wherein there is no redistribution layer on the second side.

7. A semiconductor device comprising:
a first semiconductor substrate with a first side and a second side opposite the first side;
first electrical contacts under the first side;
a metal layer extending over the second side;
a first through via, wherein the first through via has a first height greater than a distance from the first electrical contact to the metal layer;
an encapsulant extending between the first through via and the first semiconductor substrate;
a first reflowable material in physical contact with the metal layer;
a die attach film disposed over the metal layer and at least partially over a portion of the first reflowable material;
a polymer layer disposed over the die attach film and at least partially over the portion of the first reflowable material; and
a second reflowable material in physical contact with the first reflowable material and in physical contact with the polymer layer and the die attach film, the second reflowable material extending away from the first semiconductor substrate further than the polymer layer, the second reflowable material being formed of a different material than the die attach film.

8. The semiconductor device of claim 7, wherein the second reflowable material has a first diameter that is greater than a second diameter of the first reflowable material.

9. The semiconductor device of claim 7, wherein the second reflowable material has a first diameter that is less than a second diameter of the first reflowable material.

10. The semiconductor device of claim 7, wherein the metal layer comprises:
a first seed layer; and
a second seed layer different from the first seed layer.

11. The semiconductor device of claim 10, wherein the first seed layer comprises titanium and the second seed layer comprises copper.

12. The semiconductor device of claim 11, wherein the first seed layer has a thickness of about 500 Å and the second seed layer has a thickness of about 3000 Å.

13. A method of manufacturing a semiconductor device, the method comprising:
placing a metal layer on a first side of a first semiconductor substrate, wherein the first semiconductor substrate has active devices located on a second side opposite the first side;
forming a polymer layer over a second semiconductor substrate;
forming a die attach film over the polymer layer on the second semiconductor substrate;
forming a through via over the second semiconductor substrate;
placing the first semiconductor substrate, including the metal layer placed on the first side, next to the through via formed over the second semiconductor substrate;
encapsulating the first semiconductor substrate, the metal layer and the through via;
thinning the encapsulant to expose the through via;
forming a trench through the polymer layer and the die attach film to expose a portion of the metal layer; and
forming a thermally conductive feature in the trench, wherein the thermally conductive feature extends through the polymer layer and the die attach film to the metal layer, wherein the thermally conductive feature has a first portion having a first width a second portion having a second width that is different than the first width.

14. The method of claim 13, wherein forming the trench through the polymer layer and the die attach film to expose the portion of the metal layer is performed at least in part by a laser drilling method.

15. The method of claim 13, further comprising bonding a thermal die in thermal connection with the metal layer.

16. The method of claim 13, wherein the placing the metal layer further comprises:
depositing a first seed layer; and
depositing a second seed layer on the first seed layer.

17. The method of claim 13, further comprising:
bonding a carrier substrate to the first semiconductor substrate, wherein the carrier substrate has the polymer layer disposed thereover such that the polymer layer is disposed between carrier substrate and the first semiconductor substrate when the carrier substrate is bonded to the first semiconductor substrate;
removing the carrier substrate to expose the polymer layer; and
wherein exposing the metal layer through the polymer layer includes removing a portion of the polymer layer to expose the metal layer.

18. The method of claim 13, further comprising forming a protective layer over the polymer layer, and
wherein forming the trench through the polymer layer and the die attach film to expose the portion of the metal layer includes forming the trench through the protective layer.

19. The method of claim 18, wherein forming the protective layer over the polymer layer occurs after encapsulating the first semiconductor substrate, the metal layer and the through via.

20. The semiconductor device of claim 7, wherein the polymer layer has a first side and an opposing second side and the second reflowable material extends completely through the polymer layer from the first side to the second side of the polymer layer.

* * * * *